US006420818B1

(12) United States Patent
Kishimoto et al.

(10) Patent No.: US 6,420,818 B1

(45) Date of Patent: Jul. 16, 2002

(54) ELECTROACOUSTIC TRANSDUCER

(75) Inventors: Takeshi Kishimoto, Toyama-ken; Tetsuo Takeshima, Toyama, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/488,434

(22) Filed: Jan. 20, 2000

(30) Foreign Application Priority Data

Feb. 22, 1999 (JP) .......................................... 11-042587
Oct. 15, 1999 (JP) .......................................... 11-293205

(51) Int. Cl.[7] ............................................... H01L 41/08

(52) U.S. Cl. ....................... 310/324; 310/330; 310/348; 310/393; 310/368

(58) Field of Search ................................ 310/324, 328, 310/330, 348, 353, 368

(56) References Cited

U.S. PATENT DOCUMENTS

| | | | | |
|---|---|---|---|---|
| 3,856,693 A | * | 12/1974 | Kim | 252/62.9 |
| 4,006,371 A | * | 2/1977 | Quirke | 310/324 |
| 4,140,936 A | * | 2/1979 | Bullock | 310/328 |
| 5,751,200 A | * | 5/1998 | Yamashita et al. | 333/197 |
| 2001/0004180 A1 | * | 6/2001 | Kishimoto | 310/324 |

FOREIGN PATENT DOCUMENTS

| | | | | |
|---|---|---|---|---|
| JP | 63-110900 | * | 5/1988 | 310/324 |
| JP | 11-354851 | * | 12/1999 | 310/324 |
| JP | 11-355891 | * | 12/1999 | 310/324 |
| JP | 2000-134697 | * | 5/2000 | 310/324 |
| JP | 2000-305573 | * | 11/2000 | 310/324 |
| JP | 2000-310990 | * | 11/2000 | 310/324 |
| JP | 2000-312398 | * | 11/2000 | 310/324 |

* cited by examiner

*Primary Examiner*—Thomas M. Dougherty
(74) *Attorney, Agent, or Firm*—Keating & Bennett, LLP

(57) ABSTRACT

An electroacoustic transducer includes a diaphragm including a substantially rectangular metal plate and a substantially rectangular piezoelectric plate having electrodes on an upper surface and a lower surface thereof, with one of the electrodes being connected to the metal plate. A support medium including retaining parts for retaining two shorter sides of the diaphragm is provided. The shorter sides of the diaphragm are fixed to the retaining parts by an adhesive having a Young's Modulus after curing that is between about $4.0\times10^4$ N/m$^2$ and about $5.0\times10^6$ N/m$^2$. Gaps between the two longer sides of the diaphragm and the support member are sealed by an elastic sealant. The diaphragm is arranged to undergo bending vibration in a longitudinal bending mode by applying a predetermined electrical signal between the metal plate and the opposing electrode provided on the piezoelectric plate.

19 Claims, 6 Drawing Sheets

CIRCULAR DIAPHRAGM

RECTANGULAR DIAPHRAGM

ELECTROACOUSTIC TRANSDUCER

BACKGROUND OF THE INVENTION

1. Field of the Invention

The present invention relates to electroacoustic transducers, such as piezoelectric receivers, piezoelectric sounders, piezoelectric speakers, and piezoelectric buzzers, and also relates to a method for retaining piezoelectric diaphragms.

2. Description of the Related Art

In apparatuses such as portable telephones, electroacoustic transducers have been widely used as piezoelectric receivers. Generally, an electroacoustic transducer of this type includes an unimorphic diaphragm having a circular metal plate and a circular piezoelectric ceramic plate provided with electrodes, one of the electrodes being bonded to the metal plate. The diaphragm is retained at its periphery in a circular casing in which the peripheral area is enclosed by a cover. Such an electroacoustic transducer is disclosed in, for example, Japanese Unexamined Patent Application Publication No. 7-107593 or Japanese Unexamined Patent Application Publication No. 7-203590.

A circular diaphragm applied to the known electroacoustic transducer is restrained around the entire periphery thereof, whereby a maximum deflecting point P is disposed only at a central point of the diaphragm, thereby reducing the displacement. A problem with the known electroacoustic transducer is that the sound pressure that is produced by the energy generated from the displacement is small relative to the energy input for the deflection.

SUMMARY OF THE INVENTION

To overcome the problems described above, preferred embodiments of the present invention provides an electroacoustic transducer that generates high sound-pressure.

A preferred embodiment of the present invention provides an electroacoustic transducer including a diaphragm having a substantially rectangular metal plate, and a substantially rectangular piezoelectric plate having electrodes on an upper surface and a lower surface thereof, at least one of the electrodes being bonded to the substantially rectangular metal plate, a support member including retaining parts for retaining two shorter sides of the diaphragm, an adhesive having a Young's modulus after curing between about $4.0\times10^4$ N/m$^2$ and about $5.0\times10^6$ N/m$^2$ and arranged to connect the two shorter sides of the diaphragm to the retaining parts, an elastic sealant arranged to seal gaps between the two longer sides of the diaphragm and the support member, and wherein the diaphragm is arranged to vibrate in a longitudinal bending mode when a predetermined electrical signal is applied between the metal plate and the electrode provided on the upper surface of the piezoelectric plate.

According to the above described structure and arrangement of preferred embodiments of the present invention, two shorter sides of the substantially rectangular diaphragm are fixed to retaining parts of the support member, and the gaps between two longer sides of the substantially rectangular diaphragm and the support medium are sealed by the elastic sealant. The diaphragm is deflected in a longitudinal bending mode by inputting a predetermined electrical signal between the metal plate and its opposing electrode provided on a surface of the piezoelectric plate. That is, the diaphragm vertically vibrates with two longitudinal ends being supporting points which are fixed to the support medium. The two longer sides of the substantially rectangular diaphragm, which are elastically sealed by the elastic sealant, do not limit the diaphragm deflection.

The displacement caused by deflection of a circular diaphragm is small because the diaphragm is fixed to a support medium at its periphery, whereby the maximum deflecting point P is disposed only at a central point, as shown in FIG. 1A. On the other hand, the displacement caused by deflection of a substantially rectangular diaphragm is large compared with that of a circular diaphragm, because maximum deflecting points P are disposed, as shown in FIG. 1B, along an intermediate line between both longitudinal ends of the diaphragm, which enables a higher sound pressure. In other words, a substantially rectangular diaphragm is more easily miniaturized than is a circular diaphragm, when obtaining the same sound pressure level.

An epoxy-based adhesive generally used for affixing has a Young's modulus after curing on the order of about $10^7$ to about $10^6$ N/m$^2$. When both longitudinal ends of the diaphragm are fixed to a support member by such a hard adhesive, the displacement by deflection of the diaphragm cannot be large because both longitudinal ends of the diaphragm are excessively restrained. When applying a soft adhesive having a Young's modulus after curing lower than about $4.0\times10^4$ N/m$^2$, the entire diaphragm can vibrate in a nearly free state. In a completely free state, the displacement cannot be large because the diaphragm vibrates with node points at approximately one-sixth of its overall length from each longitudinal end.

FIG. 2 is a graph showing the relationship of the Young's modulus after curing of an adhesive to the displacement of a diaphragm, wherein two longer sides of the diaphragm are in a free state, and the electrical signal to be applied is a non-resonant region voltage signal.

The graph in FIG. 2 shows that the displacement is very large when the Young's modulus after curing of an adhesive is between about $4.0\times10^4$ N/m$^2$ and about $5.0\times10^6$ N/m$^2$, while there is a sharp decrease in displacement when the Young's modulus exceeds about $5.0\times10^6$ N/m$^2$.

The adhesive for fixing two longitudinal ends of the diaphragm to the support medium, according to the present invention, has a Young's modulus after curing of about $4.0\times10^4$ to about $5.0\times10^6$ N/m$^2$. The diaphragm which vibrates in a longitudinal bending mode with two longitudinal ends being supporting points can provide a larger displacement when an adhesive with a Young's modulus after curing of about $4.0\times10^4$ to about $5.0\times10^6$ N/m$^2$ is applied than when the ends are restrained or when they are in a free state. A diaphragm thus arranged can produce high sound pressure.

FIG. 3 is a graph showing the relationship of the Young's modulus after curing of an elastic sealant to the displacement of a diaphragm. The graph shows two cases, namely, a case in which an adhesive with a Young's modulus after curing of about $4\times10^5$ N/m$^2$ is applied to fix two shorter sides of the diaphragm, and the other case in which an adhesive with a Young's modulus after curing of about $4\times10^9$ N/m$^2$ is applied to fix the same. The electrical signal to be applied is a non-resonant region voltage signal.

The graph in FIG. 3 shows that the displacement is very large when the Young's modulus after curing of the sealant is about $5.0\times10^6$ N/m$^2$ or less, while it shows a sharp decrease in displacement when the Young's modulus after curing of the sealant exceeds about $5.0\times10^6$ N/m$^2$. The displacement does not change in the range of the Young's modulus after curing of the sealant being below about $4\times10^5$ N/m$^2$.

Therefore, preferably the Young's modulus after curing of the elastic sealant for sealing the gaps between two transversal ends of the diaphragm and the support medium is no more than about $5.0\times10^6$ N/m$^2$. That is, the elastic sealant is applied only to prevent air from passing through the diaphragm, therefore, the Young's modulus thereof is set to be as low as possible so as to apply the least possible restraint on the deflection of the diaphragm in a longitudinal bending mode.

The Young's modulus of an adhesive which is higher than that of the elastic sealant provides preferable characteristics when the diaphragm is placed in a bending vibration in a longitudinal bending mode.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 4:
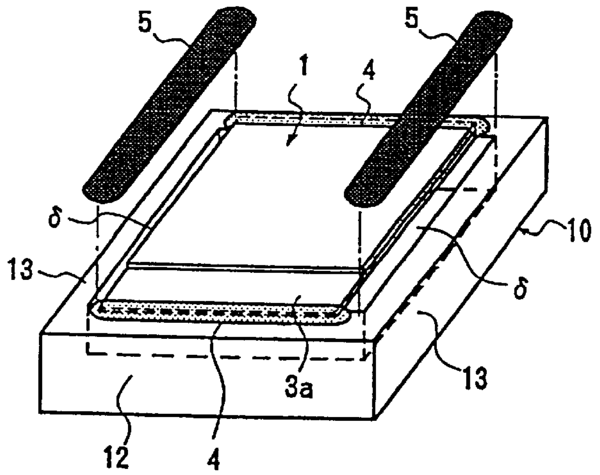
FIG. 4 is a perspective view showing an electroacoustic transducer according to a first preferred embodiment of the present invention.
Figure 5:
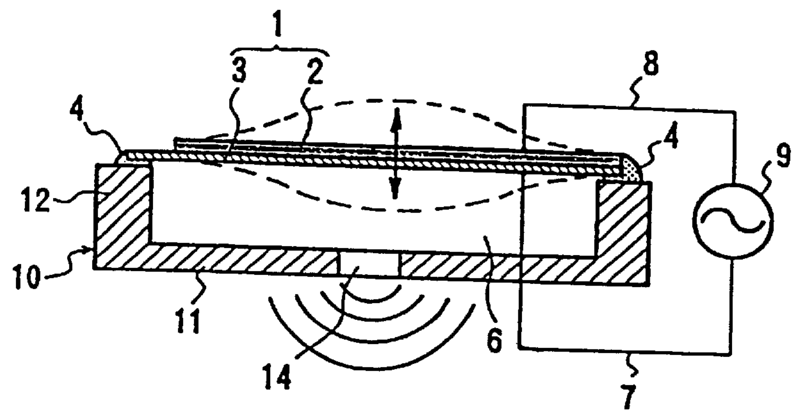
FIG. 5 is a sectional view showing the electroacoustic transducer shown in FIG. 4.

FIG. 4 and FIG. 5 are illustrations of an electroacoustic transducer applied to a piezoelectric receiver, according to a first preferred embodiment of the present invention.

The piezoelectric receiver preferably includes a unimorphic diaphragm 1 and a casing 10 as a support medium. The diaphragm 1 may be enclosed by the casing 10 and a cover over the diaphragm 1, which is not shown.

Figure 6:
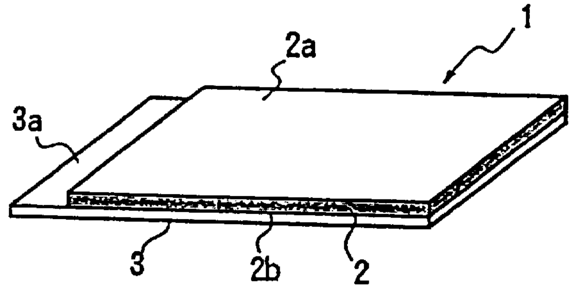
FIG. 6 is a perspective view of a diaphragm applied to the electroacoustic transducer shown in FIG. 4.

In FIG. 6, the diaphragm 1 includes a substantially rectangular piezoelectric plate 2 polarized in a thickness direction provided with thin-film or thick-film electrodes 2*a* and 2*b* on an upper surface and a lower surface thereof, and a substantially rectangular metal plate 3 having a width that is substantially the same as and a length that is somewhat greater than the piezoelectric plate 2.

The metal plate 3 is bonded to the lower surface electrode 2*b* of the piezoelectric plate 2 via an electrically conductive adhesive, or other similar materials. The metal plate 3 may be connected with the lower surface of the piezoelectric plate 2 via an electrically conductive adhesive, with the lower surface electrode 2*b* being omitted. According to the present preferred embodiment, the piezoelectric plate 2 is preferably bonded in a position that is located closer to one of the shorter sides of the metal plate 3, so that an exposed portion 3*a* of the metal plate 3 is provided at the other shorter side of the metal plate 3.

The piezoelectric plate 2 is preferably made of a piezoelectric ceramic, such as PZT. The metal plate 3 is preferably made of a material having resiliency and electrical conductivity. The material used to form the metal plate 3 preferably has a Young's modulus close to that of the piezoelectric plate 2. Therefore, a phosphor bronze, a 42Ni alloy, or other similar materials may be used. A more reliable metal plate may be obtained by a 42Ni alloy being applied to the material because the alloy has a thermal expansion coefficient close to that of ceramic, such as PZT.

The diaphragm 1 may be produced by the following process. A ceramic green sheet is punched by a blanking mold into a substantially rectangular mother substrate. The mother substrate is provided with electrodes, and then it is polarized. Then, the mother substrate is bonded to a metal motherboard with an electrically conductive adhesive or a similar substance. The bonded mother substrate and metal motherboard are cut by a tool, such as a dicer, into a substantially rectangular shape along lines along the length and width thereof to obtain diaphragms. The diaphragm 1 having a substantially rectangular shape offers advantages, such as high material efficiency, high productive efficiency, and a low equipment cost.

Referring to FIG. 5, the diaphragm 1 is retained by the casing 10 at the periphery. The casing 10 is made of an insulative material, such as a ceramic or a resin, and has a substantially rectangular box-shape which includes a bottom wall 11 and four side walls 12 and 13. When a resin is used for forming the casing 10, a heat-resistant resin, such as an LCP (liquid crystal polymer), an SPS (syndiotactic polystyrene), a PPS (polyphenylene sulfide)), or an epoxy resin is preferably used. A sound-releasing aperture 14 is provided at an approximate central portion of the bottom wall 11.

The diaphragm 1 is arranged so that the metal plate 3 included therein opposes the bottom wall 11. The two shorter sides of the diaphragm 1 are fixed by an adhesive 4 to the casing 10 at its side walls at the shorter sides 12 which define retaining parts. The adhesive 4 includes an adhesive having elasticity in a cured state, such as a urethane or a silicone, the adhesive having a Young's modulus after curing of about $4.0\times10^4$ to about $5.0\times10^6$ N/m$^2$. When the two shorter sides of the diaphragm 1 are fixed to the casing 10 at the retaining parts 12, gaps δ are formed between the longer sides of the diaphragm 1 and the side walls 13 of the casing 10. An elastic sealant 5 is provided to seal the gaps δ. The elastic sealant 5 is made of an elastic material, such as a silicone rubber or other suitable material, having a Young's modulus after curing of no more than about $5.0\times10^6$ $N/m^2$. A resonance chamber 6 is defined by the casing 10 and the diaphragm 1 disposed on the casing 10, as described above.

Lead wires 7 and 8 are connected to the metal plate 3 and the upper surface electrode 2*a* of the piezoelectric plate 2, which extend out of the casing 10 to be connected to a source 9 for outputting substantially rectangular wave signals or sine wave signals. By applying a substantially rectangular wave signal or a sine wave signal between the lead wires 7 and 8, the diaphragm 1 vibrates in a longitudinal bending mode with both longitudinal ends thereof (two shorter sides) defining supporting points. The sound generated by resonance in the resonance chamber 6 is released through the sound releasing aperture 14.

The metal plate 3 and the upper surface electrode 2*a* of the piezoelectric plate 2 may be connected to an external unit through two conducting parts provided in the casing 10, which are connected to the metal plate 3 and the upper surface electrode 2*a* by using an electrically conductive paste. The diaphragm 1 according to the present preferred embodiment, in particular, achieves advantages in that the exposed part 3*a* of the metal plate 3 and the conducting part of the casing 10, as well as the upper surface electrode 2*a* of the piezoelectric plate 2 and the other conducting part, are easily connected via conductive paste, because the upper surface electrode 2*a* and the exposed part 3*a* are upwardly exposed when the metal plate 3 is fixed opposing the bottom wall 11 of the casing 10, with the exposed part 3*a* provided at a longitudinal end of the diaphragm 1.

The following description applies to the operation of a piezoelectric receiver arranged as described above.

Figure 7:
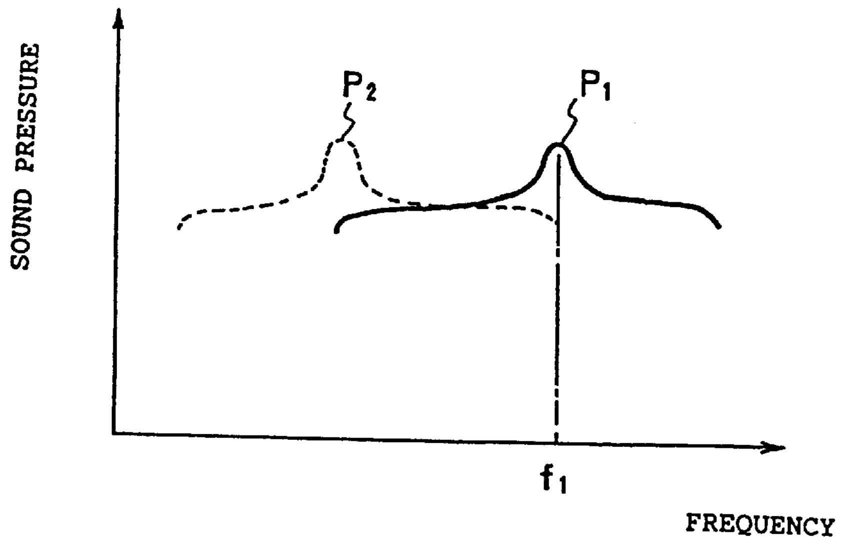
FIG. 7 is a graph showing the sound pressure characteristic of the electroacoustic transducer shown in FIG. 4.
Figure 8:
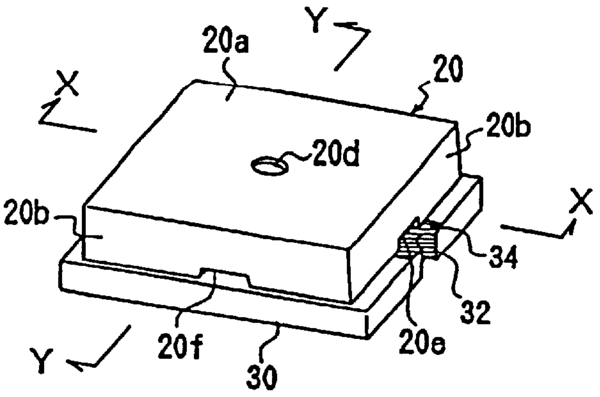
FIG. 8 is a perspective view of the electroacoustic transducer according to a second preferred embodiment of the present invention.
Figure 9:
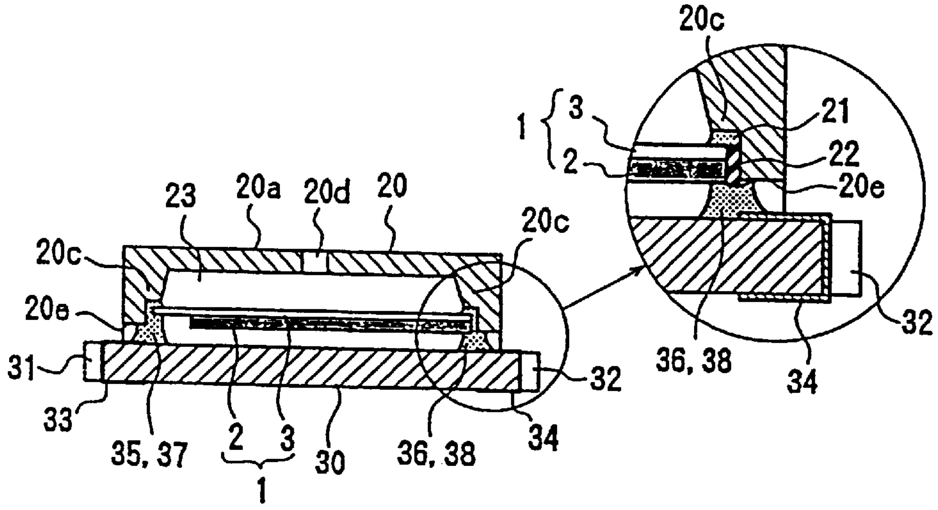
FIG. 9 is a cross-sectional view along line X—X of the electroacoustic transducer shown in FIG. 8.
Figure 10:
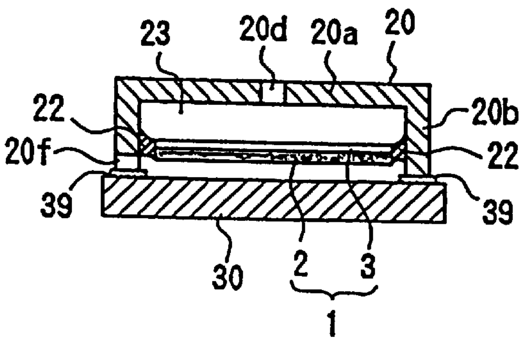
FIG. 10 is a cross-sectional view along line Y—Y of the electroacoustic transducer shown in FIG. 8.

In accordance with the change in frequency of the frequency signals applied between the lead wires 7 and 8, the sound pressure changes, as shown in FIG. 7. When the sound pressure rises to a peak $P_1$ at resonant frequency $f_1$ of the diaphragm 1, a sound pressure peak $P_2$ is generated by resonance in the resonance chamber 6 at the lower frequency side of the sound pressure peak $P_1$.

Figure 2:
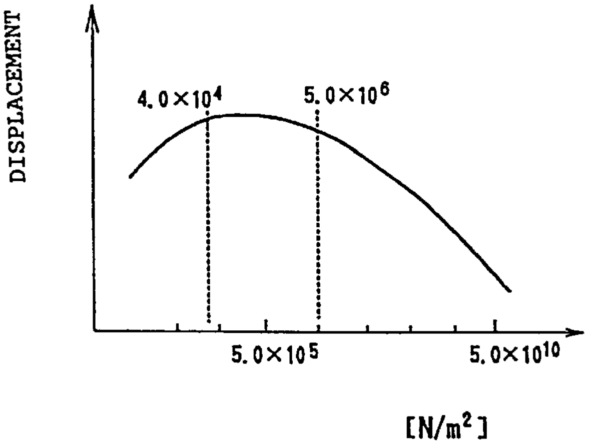
FIG. 2 is a graph showing the relationship of the Young's modulus of an adhesive after curing to the displacement of a substantially rectangular diaphragm.
Figure 3:
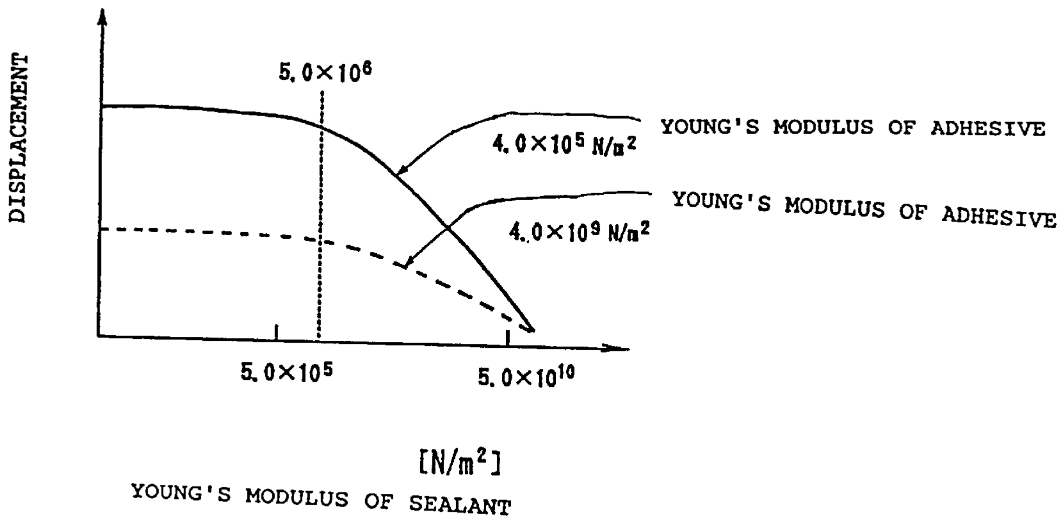
FIG. 3 is a graph showing the relationship of the Young's modulus of a sealant after curing relative to the displacement of a substantially rectangular diaphragm.

When the piezoelectric receiver is used in a non-resonant-frequency region rather than in the resonant frequency region of the diaphragm 1, the displacement of the diaphragm 1 varies in accordance with the Young's modulus of each of the adhesive 4 and the elastic sealant 5, as shown in FIG. 2 and FIG. 3. The greatest displacement which produces the highest sound pressure can be obtained when the Young's modulus of the adhesive 4 after curing is between about $4.0\times10_4$ $N/m^2$ and about $5.0\times10^6$ $N/m^2$, and the Young's modulus of the elastic sealant 5 after curing is no more than about $5.0\times10^6$ $N/M^2$. By the sound pressure peak $P_2$ obtainable by the resonance in the resonance chamber 6 at a lower frequency side of the resonant frequency, as shown in FIG. 7, an overall high sound pressure can be obtained over a wide frequency range, thereby providing the piezoelectric receiver with excellent characteristics.

FIGS. 8 to 13 show the electroacoustic transducer applied to a piezoelectric buzzer, according to a second preferred embodiment of the present invention.

The piezoelectric buzzer preferably includes a unimorph-type diaphragm 1, a cap 20, and a substrate 30. The diaphragm 1 has the same configuration as shown in FIG. 6, the same components are referred to with the same numerals, and a description thereof is omitted.

The diaphragm 1 is arranged inside of the cap 20 upside down. The cap 20 preferably has a substantially box-shaped configuration and includes an upper wall 20*a* and four side walls 20*b* made of an insulative material, such as a ceramic or a resin. Retaining parts 20*c* defined by step-shaped cut-away portions are arranged to retain two ends of the diaphragm 1 and are integrally formed inside the two side walls 20*b* opposing each other. As the retaining surfaces of the retaining parts 20*c* become smaller, sound pressure is further increased and the resonant frequency is further decreased. When a resin is used for forming the cap 20, a heat-resistant resin, such as an LCP, an SPS, a PPS, an epoxy resin, or other similar substances is preferable. A sound releasing aperture 20*d* is provided at an intermediate part of the upper wall 20*a*. Cut-away parts 20*e* are formed at opening flanges of a pair of the side walls 20*b* opposing each other. A damping hole 20*f* is provided at the opening flange of one of the remaining side walls 20*b*.

The diaphragm 1 is received in the cap 20 so that the metal plate 3 opposes the upper wall 20*a*. Two shorter sides of the diaphragm 1 are disposed on the retaining parts 20*c*, and are fixed thereto with an adhesive 21. A known insulative adhesive may be used for the adhesive 21, such as an epoxy, a urethane, a silicone, or other similar substances. The Young's modulus of the adhesive after curing is arranged to be from about $4.0\times10^4$ to about $5.0\times10^6$ $N/m^2$. When the diaphragm 1 is fixed to the retaining parts 20*c* of the cap 20 at two shorter sides of the diaphragm 1, small gaps are provided between two longer sides of the diaphragm 1 and the inner surfaces of the cap 20, which are sealed by an elastic sealant 22. The elastic sealant 22 has a Young's modulus after curing of no more than about $5.0\times10^8$ $N/m^2$, in particular, an elastic material such as a silicone rubber is used. Thus, an acoustic space 23 is defined by the diaphragm 1 and the upper wall 20*a* of the cap 20.

Figure 11:
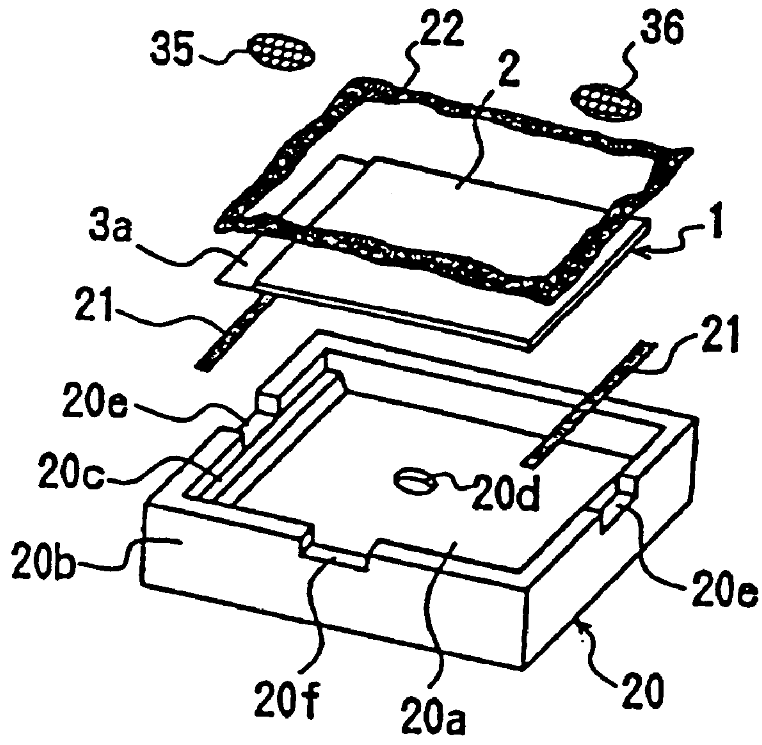
FIG. 11 is an exploded perspective view of a cap and a diaphragm from the bottom thereof.
Figure 12:
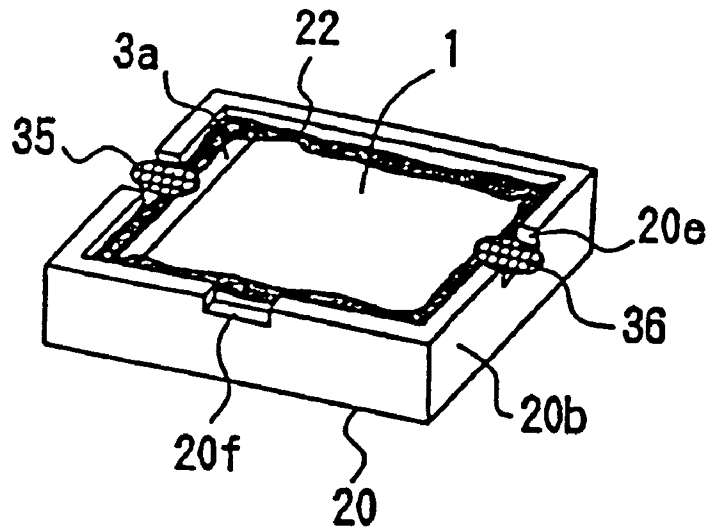
FIG. 12 is perspective view of the cap and the diaphragm in an assembled state from the bottom thereof.
Figure 13:
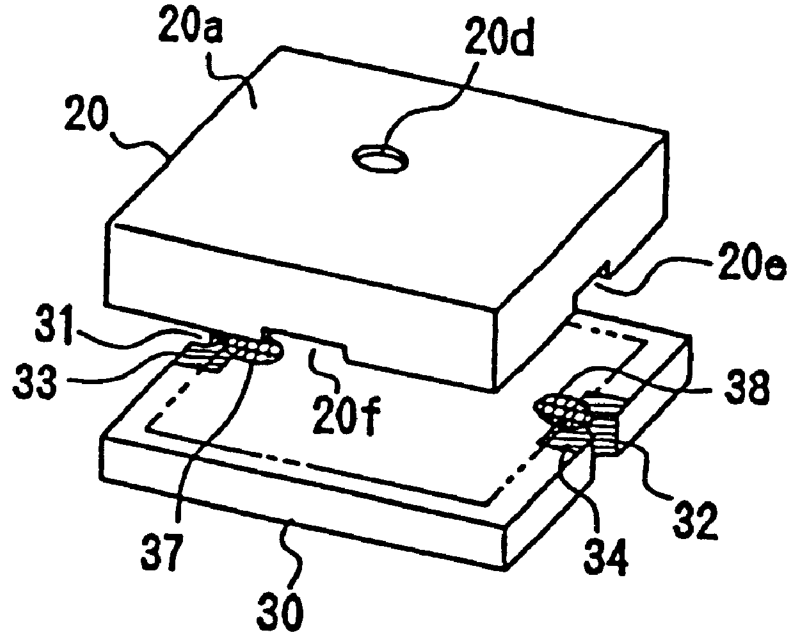
FIG. 13 is an exploded perspective view of the cap and a substrate.

The cap 20 is bonded on a substrate 30, with the diaphragm 1 fixed to the cap 20 as described above. The substrate 30 preferably includes an insulative material, such as a ceramic or a resin, and defines a substantially rectangular plate. When a resin is used for forming the substrate 30, a heat-resistant resin is used, such as an LCP, an SPS, a PPS, an epoxy resin including an epoxy-reinforced glass, or other similar substances. Electrodes 33 and 34 are arranged to extend from the upper surface to the lower surface at the longitudinal ends of the substrate 30 through through-hole grooves 31 and 32. As shown in FIG. 11 and FIG. 12, conductive pastes 35 and 36 are provided at a pair of the cut-away portions 20*e* of the cap 20, opposing each other, for example, on the exposed portion 3*a* of the metal plate 3 and the upper surface electrode 2*a* of the piezoelectric plate 2 provided at the ends of the diaphragm 1. Conductive pastes 37 and 38 are provided on the electrodes 33 and 34 of the substrate 30, which oppose the conductive pastes 35 and 36. The cap 20 is bonded on the substrate 30 at its opening flanges. The opening flanges of the cap 20 or a cap connecting portion of the substrate 30 is provided with an insulative adhesive 39 shown in FIG. 10 via screen-printing or other similar method. The conductive pastes 35 and 37 connect the exposed portion 3*a* of the metal plate 3 and the electrode 33 of the substrate 30, and the conductive pastes 36 and 38 connect the upper electrode 2*a* of the piezoelectric plate 2 and the electrode 34 of the substrate 30. By thermosetting or atmospheric-curing of the conductive pastes 35 to 38 and the insulative adhesive 39 arranged as described above, a surface-mounted piezoelectric acoustic device is completed.

By applying a predetermined frequency signal (an alternate-current signal or a rectangular wave signal)

between electrodes 33 and 34 provided on the substrate 30, the diaphragm 1 vibrates in a longitudinal bending mode with the longitudinal ends defining supporting points, as the diaphragm 1 is fixed by the retaining parts 20*c* of the cap 20 at the longitudinal ends of the diaphragm 1, and is held in an elastically deflectable state by the elastic sealant 22 at the transversal ends of the diaphragm 1. Thus, a predetermined buzzer sound is produced, which is released through the sound releasing aperture 20*d*.

According to the preferred embodiment described above, the diaphragm 1 is retained with the metal plate 3 disposed toward the upper wall 20*a* of the cap 20 so that the upper surface 2*a* of the piezoelectric plate 2 and the exposed portion 3*a* of the metal plate 3 opposes the substrate 30, in order to facilitate the bonding of the upper surface electrode 2*a* and the electrode 34, and the exposed portion 3*a* and the electrode 33 via the conductive pastes 35 to 38.

The conductive pastes 35 to 38 are provided on the cap 20 and the substrate 30 to ensure bonding, according to the above preferred embodiment. The conductive paste may be provided on one of the cap 20 and the substrate 30.

According to the present preferred embodiment, the elastic sealant 22 is provided not only at the two longer sides but also preferably at the two shorter sides of the diaphragm 1, as shown in FIG. 11. This arrangement prevents a short circuit from being caused by the paste 36 adhering to the metal plate 3 when bonding the upper surface electrode 2*a* of the piezoelectric plate 2 and the electrode 34 of the substrate 30 via the conductive pastes 36 and 38. The risk of the short-circuiting is avoided by providing an insulative film of the elastic sealant 22 at the periphery of the metal plate 3. Also, this arrangement prevents air leakage through the diaphragm 1 by sealing the entire periphery of the diaphragm 1.

The diaphragm is fixed to the top of the side walls of a box-shaped casing, as shown in FIGS. 4 and 5. However, the diaphragm may be fixed in a different manner to a substrate of a different configuration, for example, the diaphragm may be fixed to a planar substrate.

Also, the casing may be divided by a plurality of partitions, each section thus divided being provided with a diaphragm.

Figure 1A:
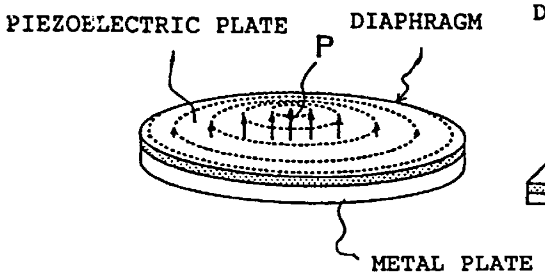
FIG. 1A shows a circular diaphragm used for comparing a deflection of the surface thereof with that of FIG. 1B.
Figure 1B:
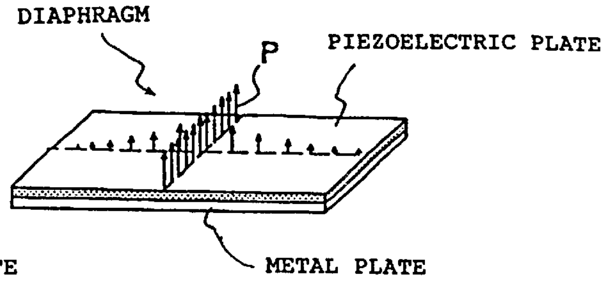
FIG. 1B shows a substantially rectangular diaphragm used for comparing a deflection of the surface thereof with that of FIG. 1A.

The diaphragm may include the entire surface of a metal plate being covered by a piezoelectric plate bonded thereon, as shown in FIG. 1B in FIG. 1, instead of the exposed portion provided at a longitudinal end of the metal plate.

A bimorphic diaphragm in which piezoelectric ceramic plates are bonded on both faces of a metal plate may be used in place of the unimorphic diaphragm according to the present preferred embodiment, in which a piezoelectric ceramic plate is bonded on one surface of the metal plate.

The diaphragm according to preferred embodiments of the present invention may be applied to electroacoustic transducers used in a non-resonant region, such as piezoelectric receivers, piezoelectric sounders, and piezoelectric speakers, and may also be applied to electroacoustic transducers used in a resonant region, such as piezoelectric buzzers, because the same characteristics of the diaphragm as shown in FIGS. 2 and 3 can also be obtained in a resonant region.

According to preferred embodiments of the present invention, as described above, the displacement of the diaphragm can be greater than that of the known circular diaphragm because the substantially rectangular diaphragm is fixed via an adhesive to retaining parts at two shorter sides of the substantially rectangular diaphragm, gaps between two longer sides of the substantially rectangular diaphragm and the substrate are sealed by an elastic sealant, and the diaphragm experiences bending vibration in a longitudinal bending mode with two shorter sides thereof defining supporting points. A greater displacement can be obtained if an adhesive having a Young's modulus of about $4.0\times10^4$ to $5.0\times10^6$ N/m$^2$ is used to fix two shorter sides of the diaphragm, thereby enabling the electroacoustic transducer to have higher sound pressure. Because of the substantially rectangular shape of the diaphragm, the diaphragm can be greatly reduced in size compared with a circular diaphragm while generating the same level of sound pressure.

When the elastic sealant has a Young's modulus after curing of no more than about $5.0\times10^6$ N/m$^2$ and the adhesive has a Young's modulus after curing of about $4.0\times10^4$ to about $5.0\times10^6$ N/m$^2$, the maximum displacement by deflection of the diaphragm can be achieved, thereby making possible an electroacoustic transducer having high acoustic-transducing efficiency.

While the invention has been particularly shown and described with reference to preferred embodiments thereof, it will be understood by those skilled in the art that the foregoing and other changes in form and details may be made therein without departing from the spirit of the invention.

What is claimed is:

1. An electroacoustic transducer comprising:

a diaphragm including a substantially rectangular metal plate and a substantially rectangular piezoelectric plate having electrodes on an upper surface and a lower surface thereof, at least one of the electrodes being bonded to a surface of the substantially rectangular metal plate;

a casing having a support member including retaining parts for retaining two shorter sides of the diaphragm;

an adhesive having a Young's modulus after curing between about $4.0\times10^4$ N/m$^2$ and about $5.0\times10^6$ N/m$^2$ and being arranged to fix the two shorter sides of the diaphragm to the retaining parts;

an elastic sealant arranged to seal gaps between the two longer sides of the diaphragm and the support member; wherein the diaphragm is arranged to vibrate in a longitudinal bending mode when a predetermined electrical signal is applied between the metal plate and the electrode provided on the upper surface of the piezoelectric plate.

2. The electroacoustic transducer according to claim 1, wherein the elastic sealant has a Young's modulus after curing of no more than about $5.0\times10^6$ N/m$^2$.

3. The electroacoustic transducer according to claim 1, wherein the electrodes comprise at least one of a thin film electrode and a thick film electrode.

4. The electroacoustic transducer according to claim 1, wherein the metal plate is made of a material having resiliency with a Young's modulus that is substantially the same as that of the piezoelectric plate.

5. The electroacoustic transducer according to claim 1, wherein the substantially rectangular metal plate has a length that is longer and a width that is substantially equal to that of the piezoelectric plate, and wherein the piezoelectric plate is bonded with the metal plate such that a portion of the length of the metal plate is exposed.

6. The electroacoustic transducer according to claim 1, wherein the casing further comprises four side walls and a bottom wall and a sound releasing aperture located at an approximate central portion of the bottom wall, wherein the metal plate opposes the bottom wall, and wherein the retaining parts include the two shorter side walls of the casing.

7. The electroacoustic transducer according to claim 1, wherein the casing is made of an insulative material including at least one of ceramic and resin.

8. The electroacoustic transducer according to claim 1, wherein the metal plate is made of at least one of phosphor bronze and 42Ni alloy.

9. The electroacoustic transducer according to claim 1, further comprising lead wires connected to the metal plate and the one of the electrodes disposed on the upper surface of the piezoelectric plate.

10. The electroacoustic transducer according to claim 1, further comprising a cover on the casing so as to enclose the diaphragm.

11. The electroacoustic transducer according to claim 1, further comprising a resonance chamber defined by the diaphragm disposed on the casing.

12. The electroacoustic transducer according to claim 1, wherein the piezoelectric plate is polarized in a thickness direction thereof.

13. An electroacoustic transducer comprising:

a diaphragm having two shorter sides and two longer sides and including:

at least one substantially rectangular metal plate; and a substantially rectangular piezoelectric plate having electrodes at an upper surface and a lower surface thereof, wherein a width of the piezoelectric plate is substantially equal to a width of the substantially rectangular metal plate and a length of the piezoelectric plate is shorter than a length of the substantially rectangular metal plate, at least one of the electrodes being bonded to a surface of the substantially rectangular metal plate such that a portion of the length of the substantially rectangular metal plate is exposed;

a casing having a support member including retaining members for retaining the two shorter sides of diaphragm;

an adhesive having a Young's modulus after curing between about $4.0\times10^4$ N/m$^2$ and about $5.0\times10^6$ N/m$^2$ and being arranged to fix the two shorter sides of the diaphragm to the retaining members; and an elastic sealant arranged to seal gaps between the two longer sides of the diaphragm and the support member.

14. The piezoelectric transducer according to claim 13, wherein the electrodes comprise at least one of a thin film electrode and a thick film electrode.

15. The piezoelectric transducer according to claim 13, wherein the substantially rectangular metal plate is made of a material having resiliency with a Young's modulus that is substantially the same as that of the piezoelectric plate.

16. The piezoelectric transducer according to claim 13, wherein the substantially rectangular metal plate is made of at least one of phosphor bronze and 42Ni alloy.

17. An electroacoustic device comprising:

a plurality of diaphragms, wherein each of the diaphragms include a substantially rectangular metal plate and a substantially rectangular piezoelectric plate having electrodes at an upper surface and a lower surface thereof, at least one of the electrodes being bonded to a surface of the substantially rectangular metal plate; and a casing having a plurality of partitions, wherein each of the partitions has a support member including retaining parts for retaining two shorter sides of the diaphragm;

an adhesive having a Young's modulus after curing between about $4.0\times10^4$ N/m$^2$ and about $5.0\times10^6$ N/m$^2$ and being arranged to fix the two shorter sides of the diaphragm to the retaining parts;

an elastic sealant arranged to seal gaps between the two longer sides of the diaphragm and the support member; wherein wherein the diaphragms are arranged vibrate in a longitudinal bending mode when a predetermined electrical signal is applied between the metal plate and the electrode provided on the upper surface of the piezoelectric plate of each of the diaphragms.

18. The electroacoustic transducer according to claim 17, wherein the piezoelectric plate is polarized in a thickness direction.

19. The electroacoustic transducer according to claim 17, wherein the elastic sealant has a Young's modulus after curing of no more than about $5.0\times10^6$ N/m$^2$.

* * * * *